United States Patent [19]

Kobayashi

[11] Patent Number: 5,791,550
[45] Date of Patent: Aug. 11, 1998

[54] METHOD AND APPARATUS FOR WIRE BONDING

[75] Inventor: Yuji Kobayashi, Santa Clara, Calif.

[73] Assignee: Shinkawa U.S.A. Incorporated, Santa Clara, Calif.

[21] Appl. No.: 691,519

[22] Filed: Aug. 2, 1996

[51] Int. Cl.⁶ ..................................................... H01L 21/60
[52] U.S. Cl. ............................................ 228/180.5; 228/4.5
[58] Field of Search ............................. 228/110.1, 180.5, 228/1.1, 4.5; 156/73.2, 580.1

[56] References Cited

U.S. PATENT DOCUMENTS

| 4,019,669 | 4/1977 | Tanimoto et al. | 228/4.5 |
| 5,031,821 | 7/1991 | Kaneda et al. | 228/110.1 |

Primary Examiner—Samuel M. Heinrich
Attorney, Agent, or Firm—Koda & Androlia

[57] ABSTRACT

So as to prevent improper wire feeding, a vibration applying device such as an electromagnetic means, etc., is provided which applies a vibration to a spool when the spool is rotated in order to feed out a wire from the spool.

3 Claims, 4 Drawing Sheets

METHOD AND APPARATUS FOR WIRE BONDING

BACKGROUND OF THE INVENTION

1. Field of the Invention

The present invention relates to a wire bonding method and apparatus and more particularly to a wire feeding method and device.

2. Prior Art

Conventional wire bonding apparatuses in which proper or improper wire feeding, etc., is detected are disclosed, for instance, in Japanese Patent Application Publication No. 8-8271. The detection of proper or improper wire feeding in this apparatus is described with reference to FIG. 6. In the above-identified Publication, a case in which a wedge is used as the bonding tool is illustrated in the drawings; however, the FIG. 6 illustrates a case in which a capillary is used as the tool. First, before the bonding operation is started, the presence or absence of the required wire is detected. This is accomplished by using a fiber sensor 4 so as to ascertain whether or not a wire 1 extends from a spool 2 to tool 3. If a sufficient amount of wire 1 is fed from the spool 2, the wire 1 is in contact with the wire contacting surface 7a of a wire contacting bridge 7 by the tension created by air 6 blown out from an air guide 5 as shown in FIG. 6 (a). In this state, the wire 1 blocks the fiber sensor 4, and therefore, "L" is outputted by the fiber sensor 4, meaning that it is a normal state. If the wire 1 does not block the fiber sensor 4, it means that there is a wire abnormality, and as a result, the apparatus is not operated. In the Figures, the reference numeral 8 is a wire guide plate, 9 indicates a clamper, and 10 indicates a bonding arm.

If it is determined in the above described wire detection that there are no abnormalities, the tool 3 is moved to a position above the first bonding point 15 and lowered onto the first bonding point 15, and the wire is bonded to the first bonding point 15 as shown in FIGS. 6 (a) and (b). Next, the damper 9 is opened, and the tool 3 is raised so as to be moved to the second bonding point 16 and then lowered, so that the wire is bonded to the second bonding point 16 as shown in FIG. 6 (c). At this time, a check is made in order to ascertain whether or not the wire 1 is blocking the fiber sensor 4. If the wire 1 is not blocking the fiber sensor 4, the operation is normal. If the wire is blocking the fiber sensor 4, this is considered to be a wire abnormality, the apparatus is stopped, and a warning lamp is lit.

If there is no wire abnormality, a motor (not shown) is rotated following the completion of the second bonding so that the spool 2 is caused to rotate, thus causing the wire I to be fed out from the spool 2 as indicated by the solid line until the wire 1 blocks the fiber sensor 4 as shown in FIG. 6 (d). Next, as shown in FIG. 6 (e), the tool 3 and damper 9 are raised together, and during this raising process, the clamper 9 is closed so that the wire 1 is cut at the root of the second bonding point 16. Next, the tool 3 is moved to a position above the next first bonding point 15 where bonding is to be performed, and a check is made to ascertain whether or not the wire 1 is blocking the fiber sensor 4. If the wire 1 is blocking the fiber sensor 4, then the operation is normal. In cases where the wire 1 is not blocking the fiber sensor 4, which is indicated by the two-dot chain line, this is considered to be a wire abnormality; and as a result, "wire abnormality" is displayed, the apparatus is stopped, and a warning lamp is lit.

Cases of the above described "wire abnormality" include an improper feeding of the wire out of the spool 2. The wire 1 is tightly wound on the spool 2; accordingly, the wire is occasionally not unwound nor fed even when the spool 2 is rotated in order to feed out the wire. Such an improper feeding results in the state shown by the two-dot chain line in FIG. 6 (d); and in such cases, the wire 1 does not block the fiber sensor 4, and the situation is judged to be a "wire abnormality".

SUMMARY OF THE INVENTION

The object of the present invention is to provide a wire bonding method and apparatus which makes it possible to prevent improper wire feeding.

The method of the present invention which is used in order to solve the problems is characterized by the fact that in a wire bonding method in which a wire wound on a spool is passed through a tool and bonded to a first bonding point and a second bonding point, a vibration is applied to the spool when the spool is rotated and the wire is fed out of the spool.

The apparatus of the present invention which is used in order to solve the above described problems is characterized by the fact that in a wire bonding apparatus in which a wire wound on a spool is passed through a tool and bonded to a first bonding point and a second bonding point, the apparatus is provided with a vibration applying means which applies a vibration to the spool when the spool is rotated and the wire is fed out of the spool.

DETAILED DESCRIPTION OF THE PREFERRED EMBODIMENTS

Figure 1:
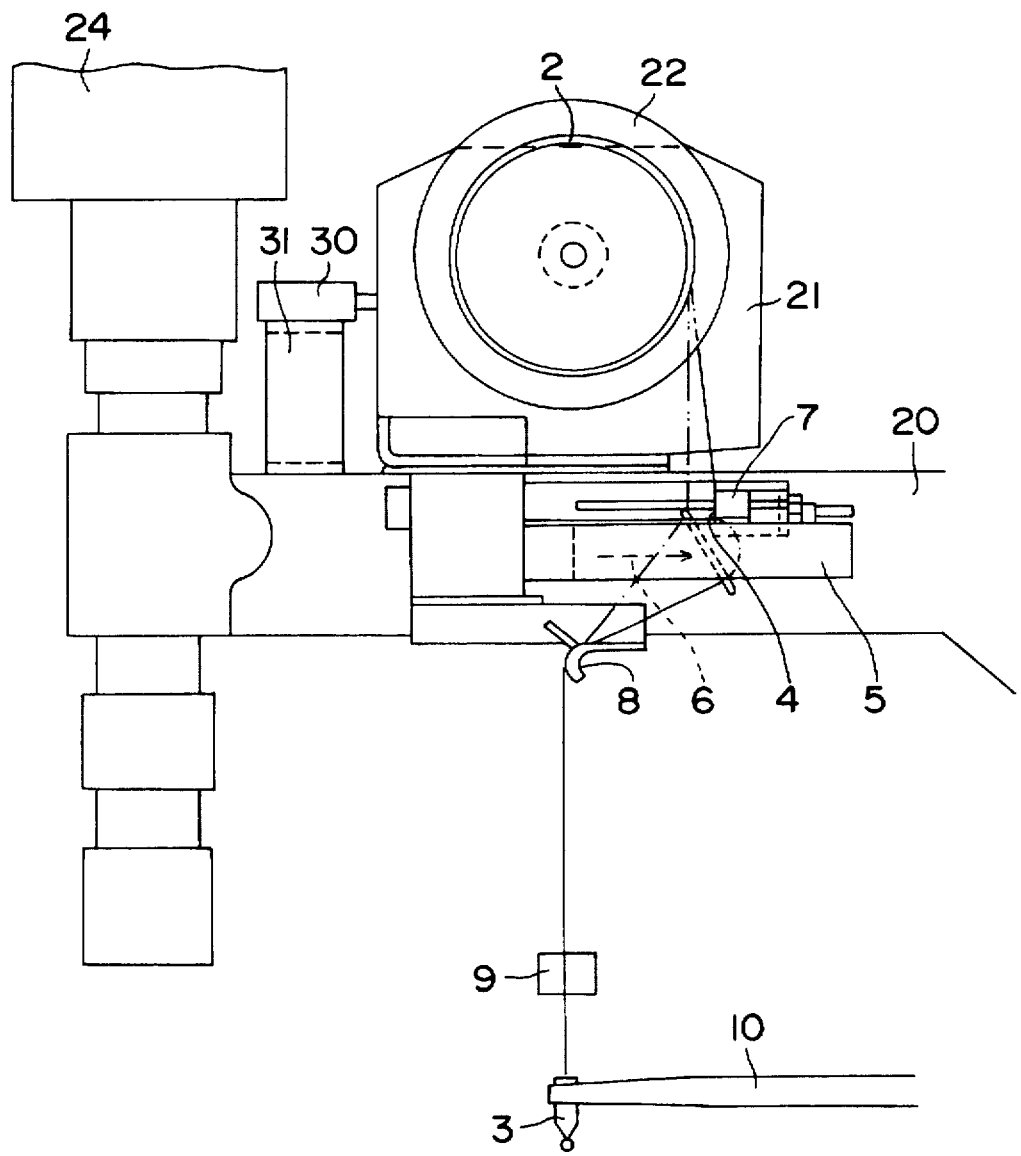
FIG. 1 is a side view which illustrates one embodiment of the present invention.
Figure 2:
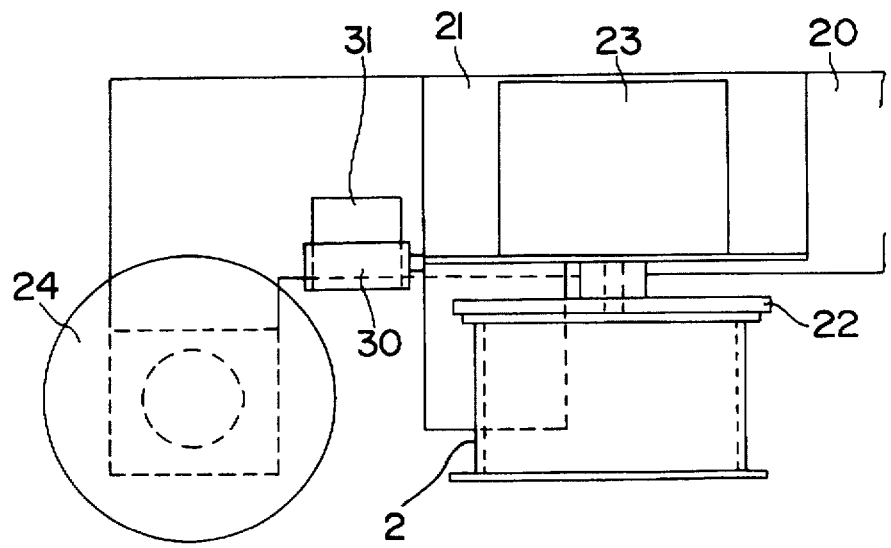
FIG. 2 a plan view of the spool part in FIG. 1.

A first embodiment of the present invention will be described with reference to FIGS. 1 and 2. Parts which are the same as in FIG. 6 are labeled with the same symbols, and a description of such parts is omitted. In this embodiment, a spool supporting plate 21 is fastened to a supporting block 20 which is provided on a bonding head (not shown), and a spool 2 is rotatably supported on the spool supporting plate 21 via a spool holder 22. Furthermore, a motor 23 is provided on the spool supporting plate 21, and a spool holder 22 is coupled to the output shaft of this motor 23. In addition, a camera 24 which detects the bonding surface is mounted on the supporting block 20. The above structure is well known, and therefore, a further description is omitted.

In this embodiment, an electromagnetic means 30 which is a solenoid, etc., is provided so that the electromagnetic means 30 contacts the side surface of the spool supporting plate 21. This electromagnetic means 30 is fastened to the supporting block 20 via a supporting plate 31. When the spool 2 is rotated so that the wire 1 is fed out as shown in FIG. 6 (d), the electromagnetic means 30 is driven in an on-and-off manner. As a result, the spool supporting plate 21 vibrates, and a vibration is applied to the spool 2. As a result of this vibration of the spool 2, the wire 1 wound on the spool 2 is loosened, so that the wire 1 is fed out as indicated by the solid line.

Figure 3:
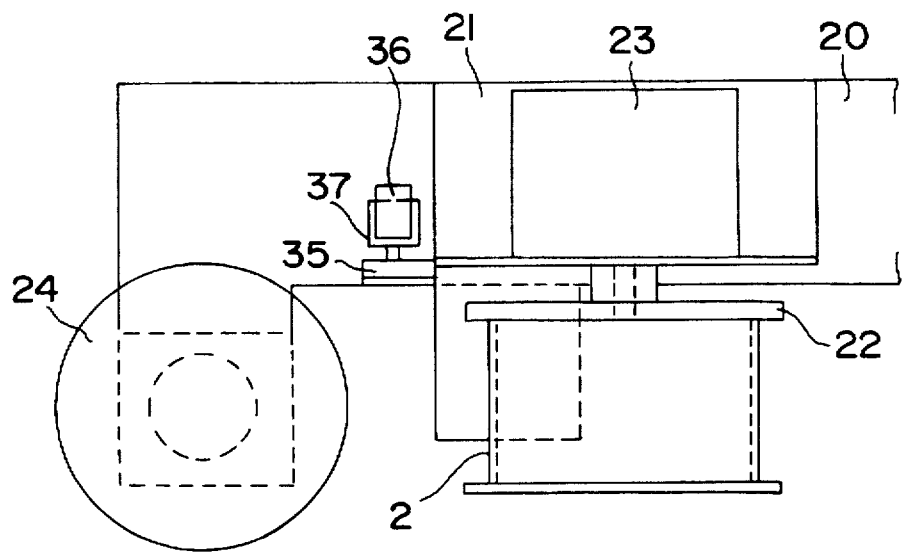
FIG. 3 is a plan view of the spool part which illustrates a second embodiment of the present invention.

FIG. 3 illustrates a second embodiment of the present invention. In this embodiment, a cam 35 is installed so that the cam 35 contacts the side surface of the spool supporting plate 21. This cam 35 is coupled to the output shaft of a motor 36. The outer circumferential surface of the cam 35 is formed with projections and indentations. The motor 36 is fastened to the supporting block 20 via a supporting plate 37. Accordingly, when the motor 36 is rotated during the feeding of the wire 1, the spool supporting plate 21 is caused to vibrate by the cam 35 so that a vibration is applied to the spool 2 as in the above described embodiment. Thus, an effect similar to that of the above described embodiment can be obtained by means of this construction as well.

Figure 4:
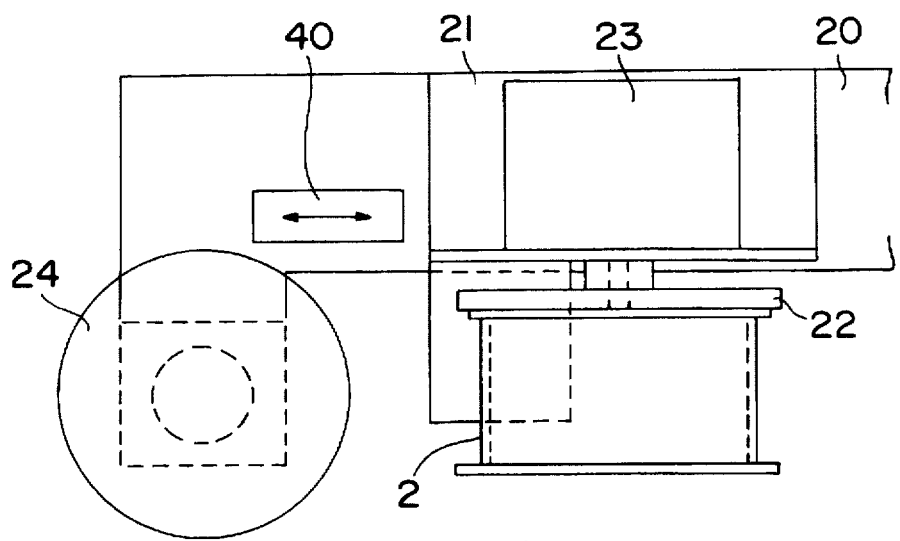
FIG. 4 is a plan view of the spool part which illustrates a third embodiment of the present invention.

FIG. 4 illustrates a third embodiment of the present invention. In this embodiment, an ultrasonic oscillator 40 is fastened to the supporting block 20. Accordingly, when this ultrasonic oscillator 40 is caused to oscillate during the feeding of the wire 1, a vibration is applied by the oscillator 40 to the supporting block 20, and this vibration is transmitted to the spool 2 via the spool supporting plate 21 as in the above described embodiments. Accordingly, an effect similar to that of the embodiments can be obtained by this construction as well.

Figure 5:
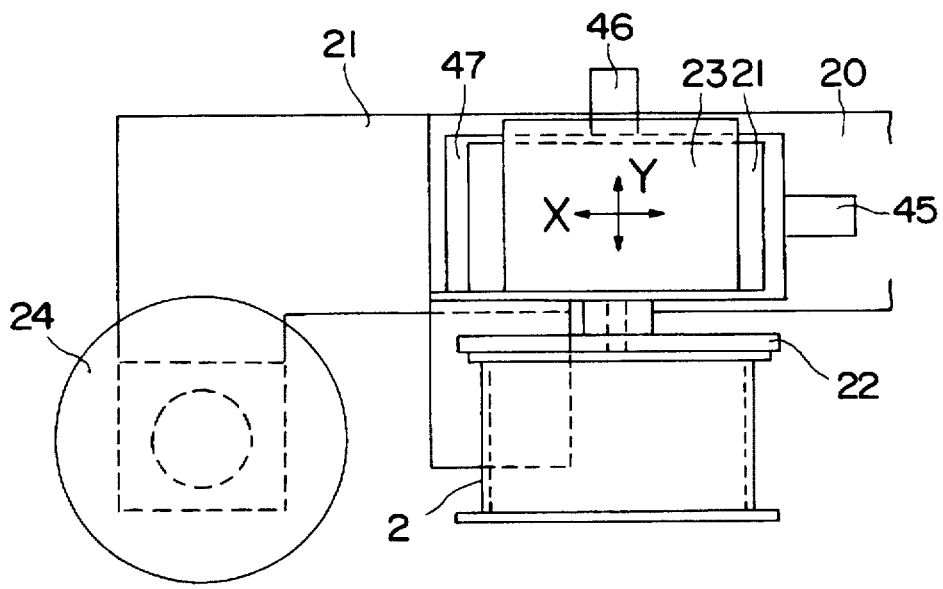
FIG. 5 is a plan view of the spool part which illustrates a fourth embodiment of the present invention.
Figure 6A:
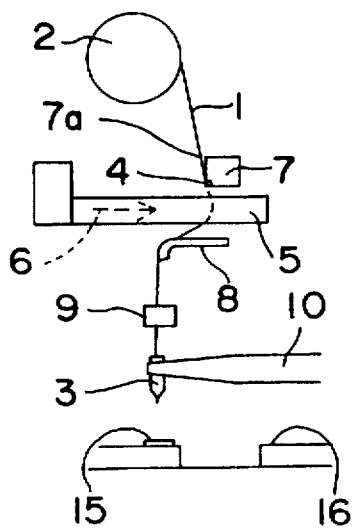
FIGS. 6(a) through 6(e) are process diagrams illustrating a wire bonding method.
Figure 6B:
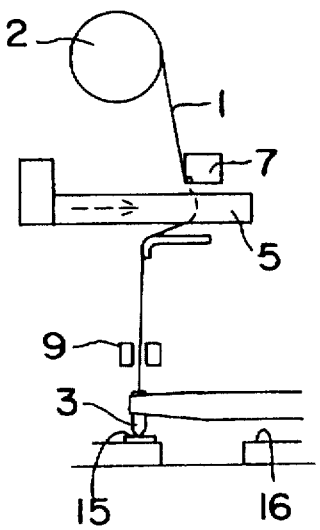
Figure 6C:
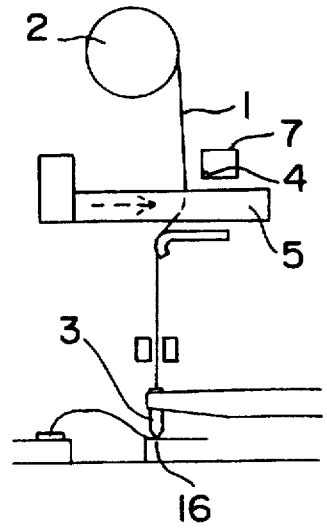
Figure 6D:
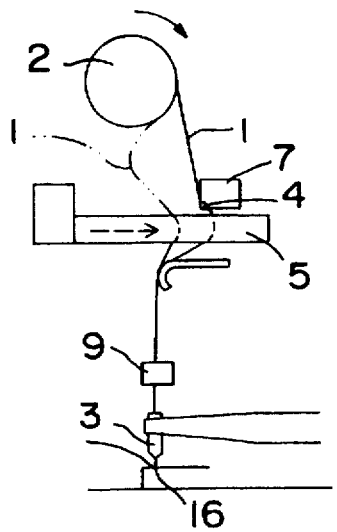
Figure 6E:
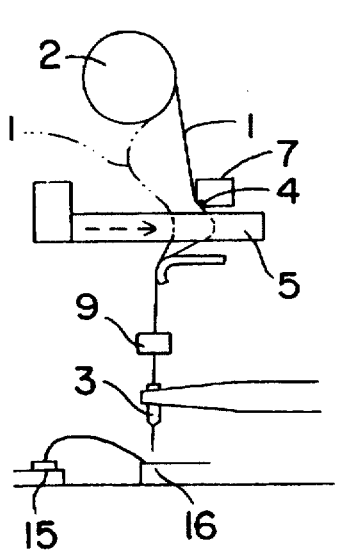

FIG. 5 illustrates a fourth embodiment of the present invention. In this embodiment, a universally known compact XY table 47 which is driven in the directions of the X and Y axes by an X-axis motor 45 and a Y-axis motor 46 is provided on the supporting block 20, and the spool supporting plate 21 is provided on this XY table 47. Accordingly, when the XY table 47 in driven in a reciprocating manner in the X direction or Y direction, or in both the X and Y directions, during the feeding of the wire 1, a vibration is applied to the spool supporting plate 21, and this vibration is transmitted to the spool 2. Thus, an effect similar to that of the above described embodiments can be obtained by this construction as well. Furthermore, in the respective embodiments described above, the tool 3 is a capillary. However, it goes without saying that the tool 3 can be a wedge.

In the present invention, a vibration is applied to the spool when the spool is rotated in order to feed out the wire. Accordingly, the wire can be loosened from the spool, and abnormal wire feeding is prevented.

I claim:

1. A wire bonding method in which a wire wound on a spool is passed through a tool and bonded to a first bonding point and a second bonding point, wherein a vibration is applied to said spool when said spool is rotated so as to feed out said wire from said spool.

2. A wire bonding apparatus in which a wire wound on a spool is passed through a tool and bonded to a first bonding point and a second bonding point, said apparatus is equipped with a vibration applying means which applies a vibration to said spool when said spool is rotated so as to feed out said wire form said spool.

3. A wire bonding apparatus, as defined in claim 2, wherein said vibration applying means is one selected from the group consisting of an electromagnetic means, cam means, ultrasonic oscillator and XY table.

* * * * *